United States Patent [19]

Chieli

[11] Patent Number: 4,929,883
[45] Date of Patent: May 29, 1990

[54] CIRCUIT FOR SENSING THE TRANSISTOR CURRENT WAVEFORM

[75] Inventor: Davide Chieli, Milan, Italy

[73] Assignee: SGS-Thomson Mircroelectronics S.r.l., Agrate Brianza MI, Italy

[21] Appl. No.: 406,500

[22] Filed: Sep. 13, 1989

[30] Foreign Application Priority Data

Sep. 15, 1988 [IT]  Italy ............................... 21955 A/88

[51] Int. Cl.$^5$ ............................................. G05F 1/565
[52] U.S. Cl. .................... 323/282; 323/280; 323/351; 323/288
[58] Field of Search ................ 323/280, 281, 282, 283, 323/284, 288, 349, 351

[56] References Cited

U.S. PATENT DOCUMENTS

| | | | |
|---|---|---|---|
| 4,072,890 | 2/1978 | Westbrook et al. | 323/288 |
| 4,107,596 | 8/1978 | Weaver et al. | 323/288 |
| 4,117,391 | 9/1978 | Janssen | 323/281 |
| 4,339,707 | 7/1982 | Gorecki | 323/281 |
| 4,638,239 | 1/1987 | Hachimori | 323/281 |
| 4,667,145 | 5/1987 | Moreau | 323/281 |

Primary Examiner—Peter S. Wong
Attorney, Agent, or Firm—Guido Modiano; Albert Josif

[57] ABSTRACT

A circuit for sensing the waveform of the current in a transistor, including a first transistor which is controlled on its base by a switching signal; a second transistor which is controlled on its base by a control signal which is inverted and delayed with respect to the switching signal, the collector of the first transistor being connected through a diode to the collector of the second transistor, the emitter of the first transistor and the emitter of the second transistor being connected to the ground; a third transistor connected with its base to the collector of the second transistor and with its emitter to the ground through a resistor, the third transistor being switched on when the second transistor is switched off and the first transistor is on.

9 Claims, 1 Drawing Sheet

CIRCUIT FOR SENSING THE TRANSISTOR CURRENT WAVEFORM

BACKGROUND OF THE INVENTION

The present invention relates to a circuit for sensing the waveform of the collector current in a transistor, in particular the switching transistor of a regulated power supply operating in current mode.

The use of power switching transistors in circuits of the so-called current-mode type, in which the waveform of the collector current of the switching transistor is controlled by resistor means, is well known in the art.

A power supply of this type is shown in FIG. 1, corresponding to the device UC 1842 or UC 1846 manufactured by SGS Microelectronics. As visible, the power supply comprises a dual loop including an error amplifier EA which compares the regulated voltage $V_O$ with an externally fed reference voltage $V_{REF}$ and generates an error signal ES. A comparator CP is provided downstream the error amplifier EA in order to compare the error signal ES, which is fed to the non-inverting input of the comparator CP, to a saw-tooth signal RA which is proportional to the saw-tooth current which flows through the collector of the switching transistor $T_S$. Said saw-tooth signal RA, generate by a sensing resistor $R_S$ connected between the emitter of the switching transistor $T_S$ and the ground, is fed to the inverting input of the comparator thus forming a feedback loop. The comparator CP generates a switching signal indicated by the letter C.

Block 2, connected to the collector of transistor $T_S$, is a part of the regulated power supply and generates the regulated output voltage $V_O$, but is not shown in detail since it is well known in the art and not necessary for the comprehension of the present invention.

In this known device, the dimensioning of the sensing resistor $R_S$ is rather difficult, since two opposite conditions must be satisfied, namely:

in order to keep the dissipated power as low as possible, the sensing resistor $R_S$ must have a low resistive value;

and on the other hand the resistance of said resistor $R_S$ must be kept relatively high in order to maximize the dynamic amplitude of the saw-tooth signal.

This in turn facilitates the comparison of the saw-tooth signal RA with the error signal ES by the comparator CP.

A solution to the above mentioned problem is disclosed in the article "Current Mirror FET's cut cost and sensing losses" (Garry Fay, in EDN, Sept. 4, 1986, pages 193–200).

Said article describes a FET sensor in which a portion of the cells of the source is used for current sensing purposes, monitoring the absorbed current without intersecting in series to the current load a high-power dissipation resistor.

However, though it solves the conflicting problems of the circuit illustrated in FIG. 1, the previously described solution can be implemented exclusively in MOS technology and cannot be made in bipolar technology.

SUMMARY OF THE INVENTION

In view of the above described situation, the aim of the present invention is to provide a current sensing circuit which can be easily implemented in various technologies, for example MOS technology or bipolar technology.

Within the above described aim, a particular object of the present invention is to provide a sensing circuit generating a good dynamic saw-tooth signal fed through a feedback loop to the comparator which controls the switching transistor and nevertheless has low power dissipation.

A further object of the invention is to provide a sensing circuit structure, of the kind used in integrated circuits, which can be implemented at low cost.

The above described aim and objects, as well as others which will become apparent hereinafter, are achieved by the circuit as defined in claim 1.

BRIEF DESCRIPTION OF THE DRAWINGS

The characteristics and advantages will become apparent from the following description of the preferred but not exclusive embodiment, illustrated only by way of non-limitative example, in the accompanying drawings, wherein.

DESCRIPTION OF THE PREFERRED EMBODIMENTS

Figure 1:
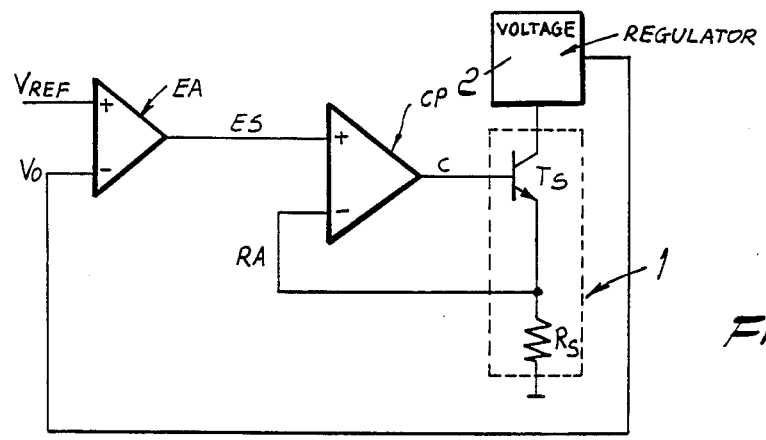
FIG. 1 is a block diagram of the prior art regulated power supply including a switching transistor and a sensing resistor.
Figure 2:
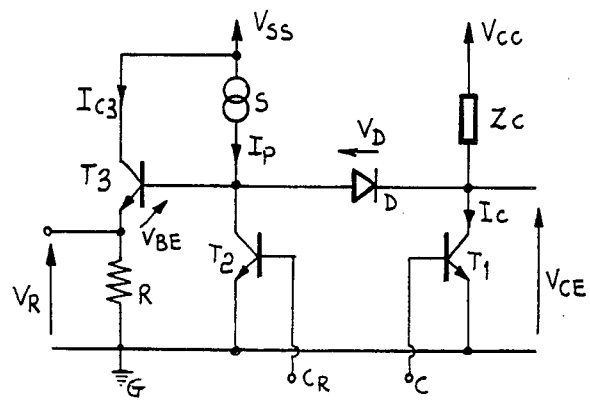
FIG. 2 is a general diagram of the switching circuit according to the invention which replaces the switching transistor and the sensing resistor of FIG. 1.
Figure 4:
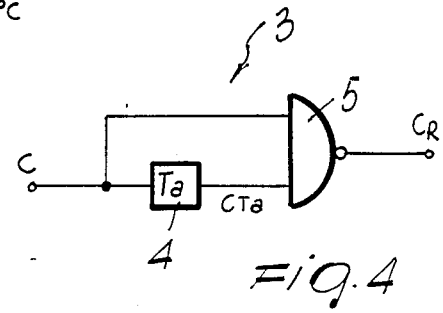
FIG. 4 is a view of an embodiment of an inverting and delay block generating a control signal $C_R$ fed to the circuit of FIG. 2.

According to the invention, the block indicated by the reference numeral 1 in FIG. 1 is replaced with the switching circuit illustrated in FIG. 2 which receives at a first input the switching signal C and at a second input a control signal $C_R$ generated by an inverting delay block 3, such as the one illustrated in FIG. 4.

The switching signal C is generated by the comparator CP, as is known in the art.

Figure 5:
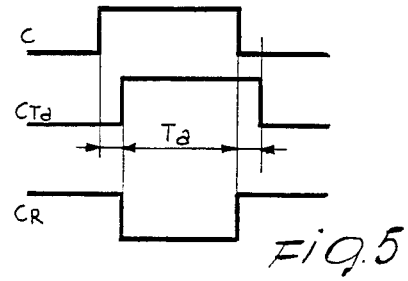
FIG. 5 is a time plot of the signals C and $C_R$.

In the circuit of FIG. 4, said switching signal C is delayed by the delay block 4, indicated by $T_a$, while the inversion is completed by means of the NAND gate 5. In particular, the resulting control signal $C_R$ is inverted and has a falling edge delayed with respect to the leading edge of the switching signal C, as illustrated in FIG. 5. The delay block has a conventional structure and comprises, for example, resistor means and capacitor means, as is well known in the art.

The control signal $C_R$ is used, together with switching signal C, for controlling the switching circuit illustrated in FIG. 2.

A first supply voltage line $V_{SS}$ and a second supply voltage line $V_{CC}$ feed the switching circuit; said voltage lines $V_{SS}$ and $V_{CC}$, defining reference potential lines, are not necessarily equal to one another.

The switching transistor is here defined by a first transistor $T_1$, which is preferably constituted by a power transistor and has a collector current $I_C$; said transistor is controlled by said switching signal C which is applied to its base.

The collector of said first transistor $T_1$ is connected, through an impedance $Z_C$, to the second supply voltage line $V_{CC}$ and to the cathode of a diode D, while the emitter of said first transistor $T_1$ is connected to the ground G defining a further reference potential line. The impedance $Z_C$ represents the block 2 of FIG. 1 if the switching circuit of FIG. 2 is used in a power supply of the type shown in FIG. 1, but may represent any load fed by the collector current of transistor $T_1$.

The switching circuit further comprises a second transistor $T_2$ which defines a switch element and is controlled by the control signal $C_R$ applied to its base. As can be seen, the collector of the second transistor $T_2$ is connected to the anode of said diode D, to a current source S which generates a constant current $I_P$, and to the base of a third transistor $T_3$ defining a transducing transistor. The emitter of said second transistor is connected to the ground.

The current source S is fed by said first supply voltage line $V_{SS}$ which is also connected to the collector of the third transistor $T_3$. The emitter of the third transistor is connected to the ground through resistor R.

It is evident that while the switching signal C is active and the control signal $C_R$ is low, the first transistor $T_1$ is on while the second transistor $T_2$ is off and the third transistor $T_3$ is on since it is not short-circuited by the second transistor. The voltage drop $V_P$ across the diode D is approximately equal to the base-emitter voltage drop $V_{BE}$ across said third transistor $T_3$ so that the voltage drop $V_R$ across the resistor R (corresponding to signal RA of FIG. 1 to be fed to comparator CP) is consequently equal to the collector-emitter voltage drop across said first transistor $T_1$. In practice, the pair of elements constituted by the third transistor $T_3$ and by the diode D acts as a differential amplifier controlled by transistor $T_2$ which switches off the differential amplifier when signal $C_R$ is high. If $R_{ON}$ designates the equivalent conducting resistivity of the first transistor and $I_C$ indicates the collector current thereof, since:

$$V_{CE}=R_{ON}\cdot I_C,$$

$V_R=V_{CE}$ is consequently a linear function of said collector current $I_C$, and $I_{C3}$, i.e. the collector current of said third transistor $T_3$, is also a linear function of the collector current $I_C$.

When the second transistor is switched on by the control signal $C_R$ and the switching signal C becomes inactive, the first transistor $T_1$ switches off and the current source S is connected to ground through transistor $T_2$, thus causing the third transistor $T_3$ to switch off.

Figure 3:
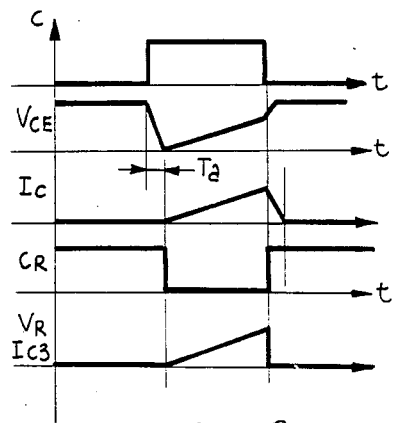
FIG. 3 is a waveform diagram of some electrical signals generated by the switching circuit of FIG. 2.

The switching signal C and the control signal $C_R$, as illustrated in the diagram of FIG. 3, therefore allow to extract the waveform of the collector currents $I_C$ and $I_{C3}$.

According to the switching time of the first power transistor $T_1$, the falling edge of the signal $C_R$ must be delayed by the time $T_a$ with respect to the leading edge of the switching signal C, thus the third transistor $T_3$ is switched off after the first transistor $T_1$ is switched on.

A simple estimate calculation which compares the power dissipated on the resistor $R_S$ illustrated in FIG. 1 to the power dissipated by the resistor R of the present invention shows that the invention achieves its aim.

With reference to FIG. 1, if the power transistor $T_S$ in the conducting state has an equivalent resistance of 1 $\Omega$, the resistor $R_S$ has a value of 1 $\Omega$ and the collector current $I_C$ is of 1 A, the power dissipated by $R_S$ is 1 W, while the power dissipated by $T_S$ is also 1 W.

With reference to the present invention and to FIG. 2, if resistor R has a value of 1 K$\Omega$, and assuming the first transistor $T_1$ has characteristics which are similar to those of $T_S$, since $V_{CE}=V_R$, consequently $I_{C3}$ is 1 mA.

As $V_{SS}$ might be of the order of 10 V, the power dissipation of the third transistor $T_3$ is about 10 V $\times$ 1 mA = 10 mW. The current $I_P$ which is fed by the source S which feeds the third transistor $T_3$ is of the order of 10 $\mu$A, while the NAND gate which feeds the signal $C_R$ also has a consumption in the range of a few mW. All the power consumption estimates approximately correspond to practical values.

With the above values, the power consumption of the circuit of FIG. 2 is in the range of 10 mW, and is therefore much lower than the one of block 1, while the dynamic excursion of the signals across $R_S$ and R is identical.

The increase in the number of components employed with respect to the known art is completely compensated by the power savings.

The invention thus conceived is susceptible to numerous modifications and variations, all of which are within the scope of the inventive concept. In particular, it should be noted that though a specific embodiment employing bipolar technology has been illustrated, an implementation in MOS technology is also possible.

The transistors may furthermore be replaced with equivalent switching means.

Furthermore, the current sensing circuit of FIG. 2 may be applied to any device including a controlled transistor such as $T_1$, the collector current of which should be controlled with high dynamics and low dissipation and is not limited to regulated power supply as shown in FIG. 1.

I claim:

1. A circuit for sensing a transistor current waveform, including a switching transistor having collector and emitter terminals connected between a first and a second reference potential line, and a base terminal receiving a switching signal, and a transducing differential amplifier circuit connected at the input to said collector and emitter terminals of said switching transistor and generating at the output a transduced voltage proportional to the emitter to collector voltage of said switching transistor, said transduced voltage being fed to a sensing resistor arranged between the output of said transducing differential amplifier circuit and said second reference potential line and generating a sensing current proportional to the collector current of said switching transistor.

2. A circuit according to claim 1, wherein said transducing differential amplifier circuit comprises a transducing transistor having its collector terminal connected to a third reference potential line, its emitter terminal connected to said second reference potential line through said sensing resistor and its base terminal connected to a switch element receiving a control signal correlated to said switching signal, said transducing differential amplifier circuit further comprising a diode connected between said base terminal of said transducing transistor and said collector terminal of said switching transistor.

3. A circuit according to claim 2, wherein said switch element comprises a control transistor having its collector terminal connected to said base terminal of said transducing transistor, its emitter terminal connected to said second reference potential line and its base terminal receiving said control signal being opposed to said switching signal.

4. A circuit according to claim 3, wherein said control signal has a falling edge delayed with respect to a leading edge of said switching signal.

5. A circuit according to claim 3, comprising a delay means receiving said switching signal and generating a delayed signal and a NAND gate having a first input receiving said switching signal, a second input receiving said delayed signal and an output generating said control signal.

6. A circuit according to claim 5, wherein said delay means defines a delay time corresponding to the reaction time of the switching transistor.

7. A circuit according to claim 2, comprising a current source connected between said third reference potential line and said base terminal of said transducing transistor.

8. A circuit according to claim 1, wherein said switching transistor is a power transistor.

9. A circuit according to claim 1, wherein said second reference potential line is the ground.

* * * * *